US006426259B1

United States Patent
Yu

(10) Patent No.: US 6,426,259 B1
(45) Date of Patent: Jul. 30, 2002

(54) VERTICAL FIELD EFFECT TRANSISTOR WITH METAL OXIDE AS SIDEWALL GATE INSULATOR

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/713,754

(22) Filed: Nov. 15, 2000

(51) Int. Cl.$^7$ .............................................. H01L 21/336
(52) U.S. Cl. ...................... 438/269; 438/212; 438/156; 438/274; 257/302; 257/328; 257/335
(58) Field of Search ................................ 438/197, 268, 438/269, 296, 297, 301, 212, 681, 486, 508, 270, 271, 272, 273, 274, 138, 156, 173, 192; 257/135, 302, 328, 329, 330, 335

(56) References Cited

U.S. PATENT DOCUMENTS

| | | | | | |
|---|---|---|---|---|---|
| 4,375,717 A | * | 3/1983 | Tonnel | ........................ | 29/571 |
| 5,106,778 A | * | 4/1992 | Hollis et al. | ................... | 437/90 |
| 5,225,697 A | * | 7/1993 | Malhi et al. | ................. | 257/302 |
| 5,308,778 A | * | 5/1994 | Fitch et al. | .................... | 437/40 |
| 5,324,673 A | * | 6/1994 | Fitch et al. | .................... | 437/40 |
| 5,364,810 A | * | 11/1994 | Kosa et al. | .................... | 437/38 |
| 5,398,200 A | * | 3/1995 | Mazuré et al. | .............. | 365/174 |
| 5,599,724 A | * | 2/1997 | Yoshida | ........................ | 437/40 |
| 5,612,559 A | * | 3/1997 | Park et al. | ................... | 257/302 |
| 5,668,391 A | * | 9/1997 | Kim et al. | ................... | 257/328 |
| 5,672,889 A | * | 9/1997 | Brown | ......................... | 257/77 |
| 5,821,579 A | * | 10/1998 | Choi et al. | ................... | 257/302 |
| 5,886,382 A | * | 3/1999 | Witek | .......................... | 257/329 |
| 6,197,641 B1 | * | 3/2001 | Hergenrother et al. | ...... | 438/268 |
| 6,373,091 B2 | * | 4/2002 | Horak et al. | ................ | 257/306 |
| 6,392,271 B1 | * | 5/2002 | Alavi et al. | ................. | 257/328 |

OTHER PUBLICATIONS

Wolf and Tauber; Silicon Processing for the VLSI Era vol. 1: Process Technology; pp. 332–333; copyright 1986, Lattice Press; Sunset Beach, CA.*

* cited by examiner

Primary Examiner—Wael Fahmy
Assistant Examiner—Fernando Toledo
(74) Attorney, Agent, or Firm—Monica H. Choi

(57) ABSTRACT

For fabricating a vertical field effect transistor on a semiconductor substrate, a first layer of dielectric material is deposited on the semiconductor substrate. A layer of metal is then deposited on the first layer of dielectric material, and a second layer of dielectric material is deposited on the layer of metal. A channel opening is etched through the second layer of dielectric material, the layer of metal, and the first layer of dielectric material. A source and drain dopant is implanted through the channel opening and into the semiconductor substrate to form a drain region of the vertical field effect transistor in the semiconductor substrate. Metal oxide is then formed at any exposed surface of the layer of metal on sidewalls of the channel opening in a thermal oxidation process to form a gate dielectric of the vertical field effect transistor. The channel opening is filled with a semiconductor material, and a semiconductor structure is also grown from the semiconductor material filling the channel opening, with the semiconductor structure extending above the channel opening. The source and drain dopant is also implanted into the semiconductor structure to form a source region of the vertical field effect transistor. A thermal anneal is performed such that the drain region extends into the channel opening to be between the metal oxide at the sidewalls of the channel opening and such that the source region extends into the channel opening to be between the metal oxide at the sidewalls of the channel opening. A portion of the semiconductor material in the channel opening remains undoped without the source and drain dopant between the drain region and the source region to form a channel region of the vertical field effect transistor.

10 Claims, 4 Drawing Sheets

VERTICAL FIELD EFFECT TRANSISTOR WITH METAL OXIDE AS SIDEWALL GATE INSULATOR

TECHNICAL FIELD

The present invention relates generally to field effect transistors of integrated circuits, and more particularly, to a vertical field effect transistor with metal oxide as a sidewall gate insulator for a double-gate or a surrounded gate structure.

BACKGROUND OF THE INVENTION

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be comprised of polysilicon. A gate silicide 120 is formed on the polysilicon gate structure 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate structure 118 and the gate dielectric 116. When the spacer 122 is comprised of silicon nitride ($Si_3N_4$), then a spacer liner oxide 124 is deposited as a buffer layer between the spacer 122 and the sidewalls of the gate structure 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100 are scaled down further, such as tens of nanometers for the gate length of the MOSFET 100 for example, the MOSFET 100 exhibits disadvantageous short channel effects, as known to one of ordinary skill in the art of integrated circuit fabrication. Thus, scaling down the dimensions of the MOSFET 100 with the drain extension junction 104, the drain contact junction 108, the source extension junction 106, and the source contact junction 112 fabricated laterally within the semiconductor substrate 102 may be limited by such short channel effects, as known to one of ordinary skill in the art of integrated circuit fabrication.

Nevertheless, a MOSFET that occupies less area of the semiconductor substrate 102 is desired for fabrication of more compact integrated circuits. In addition, minimization of short channel effects is desired as the dimensions of the MOSFET are scaled down further. Thus, a novel MOSFET structure that occupies less area of the semiconductor substrate with minimized short channel effects is desired.

SUMMARY OF THE INVENTION

Accordingly, in a general aspect of the present invention, a vertical field effect transistor is fabricated to have a double gate structure or a surrounded gate structure for minimizing short channel effects in the vertical field effect transistor.

In one embodiment of the present invention, for fabricating a vertical field effect transistor on a semiconductor substrate, a first layer of dielectric material is deposited on the semiconductor substrate. A layer of metal is then deposited on the first layer of dielectric material, and a second layer of dielectric material is deposited on the layer of metal. A channel opening is etched through the second layer of dielectric material, the layer of metal, and the first layer of dielectric material. A source and drain dopant is implanted through the channel opening and into the semiconductor substrate to form a drain region of the vertical field effect transistor in the semiconductor substrate. Metal oxide is then formed at any exposed surface of the layer of metal on sidewalls of the channel opening in a thermal oxidation process, and the metal oxide is a gate dielectric of the vertical field effect transistor.

The channel opening is filled with a semiconductor material by epitaxially growing the semiconductor material from the semiconductor substrate at a bottom wall of the channel opening. A semiconductor structure is also grown from the semiconductor material filling the channel opening, and the semiconductor structure extends above the channel opening.

The source and drain dopant is also implanted into the semiconductor structure to form a source region of the vertical field effect transistor. A thermal anneal is performed such that the drain region extends into the channel opening to be between the metal oxide at the sidewalls of the channel opening and such that the source region extends into the channel opening to be between the metal oxide at the sidewalls of the channel opening. A portion of the semiconductor material in the channel opening remains undoped without the source and drain dopant between the drain region and the source region to form a channel region of the vertical field effect transistor.

The present invention may be used to particular advantage when the first layer of dielectric material and the second layer of dielectric material are comprised of silicon dioxide having a thickness in a range of from about 300 Å to about 500 Å, when the layer of metal is comprised of one of aluminum, titanium, or tantalum having a thickness in a range of from about 200 Å to about 1000 Å, and when the metal oxide is comprised of one of aluminum oxide ($Al_2O_3$), titanium oxide ($TiO_2$), and tantalum oxide ($Ta_2O_5$).

In this manner, because the drain region, the channel region, and the source region of the vertical field effect transistor are formed vertically upward from the semiconductor substrate, the field effect transistor may occupy less space of the semiconductor substrate than the conventional lateral field effect transistor of the prior art. In addition, because the gate of the vertical field effect transistor is formed at a plurality of sidewalls of the channel opening, short channel effects of the vertical field effect transistor may be further controlled and prevented.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and function.

DETAILED DESCRIPTION

Figure 2:
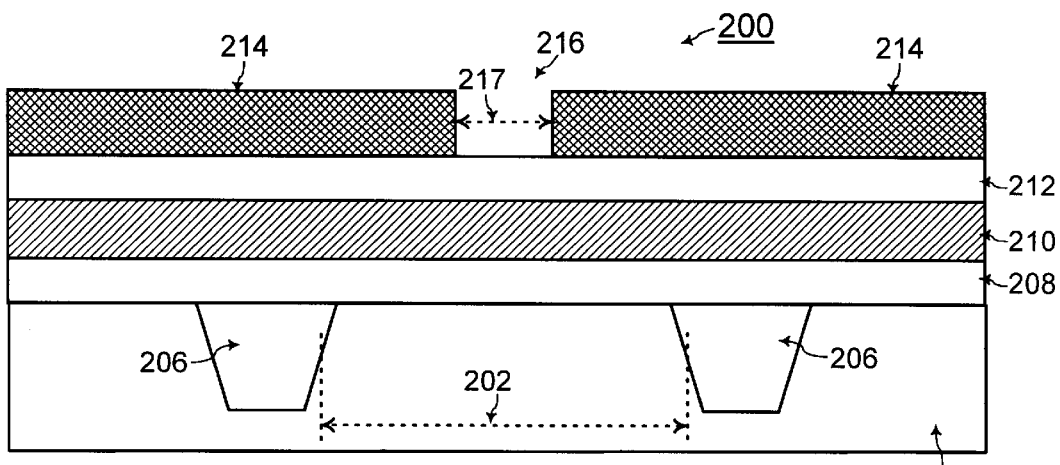
FIGS. 2, 3, 4, 5, 6, 7, 8, and 9 show cross-sectional views for illustrating the steps for fabrication of a vertical field effect transistor by forming the drain region, the channel region, and the source region vertically upward from the semiconductor substrate, according to an embodiment of the present invention.

In the cross-sectional view of FIG. 2, an active device area 202 is formed in a semiconductor substrate 204 by STI (shallow trench isolation) structures 206. The semiconductor substrate 204 may be comprised of silicon in one embodiment of the present invention. STI (shallow trench isolation) technology for electrical isolation of an active device area is known to one of ordinary skill in the art of integrated circuit fabrication.

For formation of a vertical MOSFET (Metal Oxide Semiconductor Field Effect Transistor) 200 according to an aspect of the present invention, a first layer of dielectric material 208 is deposited on the semiconductor substrate 204. In addition, a layer of metal 210 is deposited on the first layer of dielectric material 208, and a second layer of dielectric material 212 is deposited on the layer of metal 210. In one embodiment of the present invention, the first layer of dielectric material 208 and the second layer of dielectric material 212 are comprised of silicon dioxide having a thickness in a range of from about 300 Å (angstroms) to about 500 Å (angstroms). In addition, in an example embodiment of the present invention, the layer of metal 210 is comprised of one of aluminum, titanium, or tantalum having a thickness in a range of from about 200 Å (angstroms) to about 1000 Å (angstroms). Processes for deposition of such material for the first layer of dielectric material 208, the second layer of dielectric material 212, and the layer of metal 210 are known to one of ordinary skill in the art of integrated circuit fabrication.

Further referring to FIG. 2, a layer of photoresist material 214 is deposited on the second layer of dielectric material 212, and the layer of photoresist material 214 is patterned to form a channel opening 216. In one embodiment of the present invention, the width 217 of the channel opening 216 is in a range of from about 10 nanometers to about 50 nanometers. Processes for depositing and patterning the photoresist material 214 to form the channel opening 216 are known to one of ordinary skill in the art of integrated circuit fabrication.

Figure 3:
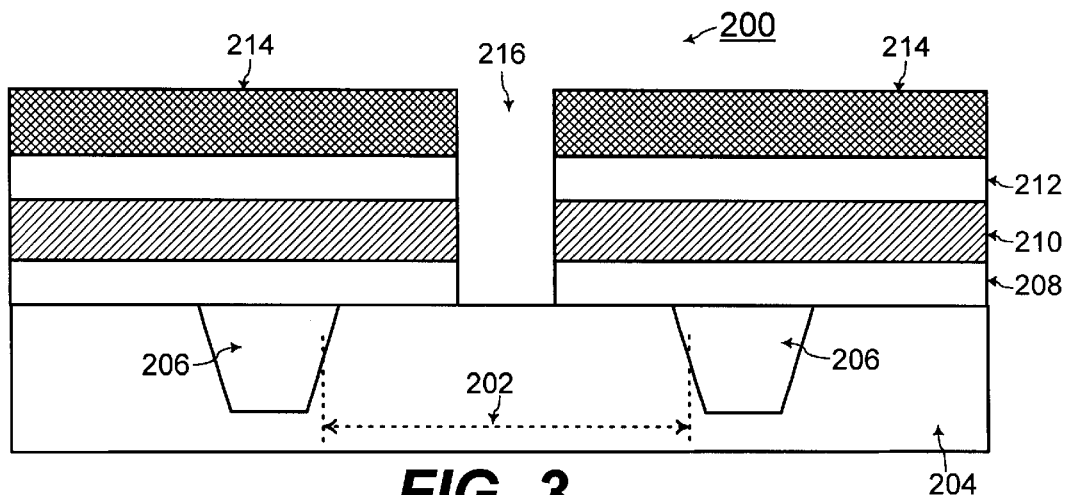

Referring to FIGS. 2 and 3, the first layer of dielectric material 208, the second layer of dielectric material 212, and the layer of metal 210 under the channel opening 216 are etched to extend the channel opening 216 through the first layer of dielectric material 208, the second layer of dielectric material 212, and the layer of metal 210 to the semiconductor substrate 204. Processes for etching through the first layer of dielectric material 208, the second layer of dielectric material 212, and the layer of metal 210 to form the channel opening 216 are known to one of ordinary skill in the art of integrated circuit fabrication.

Figure 4:
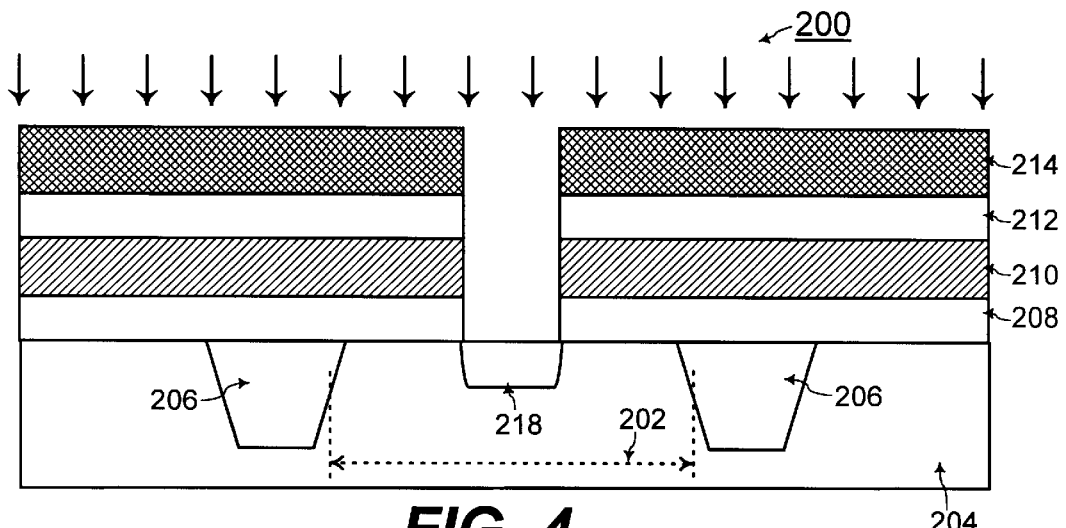

Referring to FIG. 4, a source and drain dopant is implanted through the channel opening 216 into the semiconductor substrate 204 to form a drain region 218 in the semiconductor substrate 204. The photoresist layer 214 blocks the source and drain dopant such that the drain region 218 is formed substantially under the channel opening 216 in the active device area 202 of the semiconductor substrate 204. Processes for implanting the source and drain dopant through the channel opening 216 to form the drain region 218 are known to one of ordinary skill in the art of integrated circuit fabrication.

Figure 5:
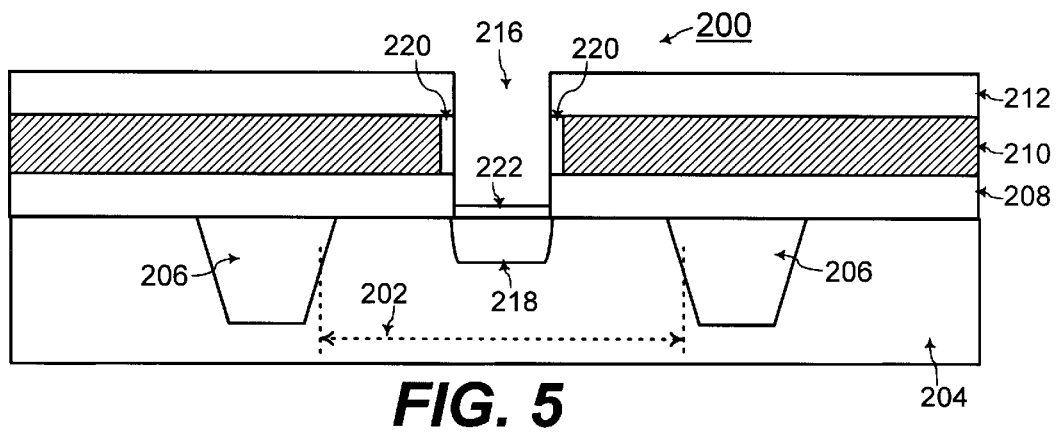

Referring to FIGS. 4 and 5, the layer of photoresist material 214 is removed from the second layer of dielectric material 212. Processes for removal of photoresist material 214 are known to one of ordinary skill in the art of integrated circuit fabrication. Referring to FIG. 5, a thermal oxidation process is performed to form metal oxide 220 at any exposed surface of the layer of metal 210 on sidewalls of the channel opening 216. When the layer of metal 210 is comprised of aluminum, the metal oxide 220 is comprised of aluminum oxide ($Al_2O_3$). When the layer of metal 210 is comprised of titanium, the metal oxide 220 is comprised of titanium oxide ($TiO_2$). When the layer of metal 210 is comprised of tantalum, the metal oxide 220 is comprised of tantalum oxide ($Ta_2O_5$). Thermal oxidation processes for formation of metal oxide at exposed surfaces of metal are known to one of ordinary skill in the art of integrated circuit fabrication.

When the semiconductor substrate 204 is comprised of silicon, silicon dioxide 222 ($SiO_2$) may also form at the bottom wall of the channel opening 216 during the thermal oxidation process for forming the metal oxide 220. In that case, the silicon dioxide 222 at the bottom wall of the channel opening 216 is etched away from the semiconductor substrate 204. Processes for etching away silicon dioxide from the semiconductor substrate 204 are known to one of ordinary skill in the art of integrated circuit fabrication.

Figure 6:
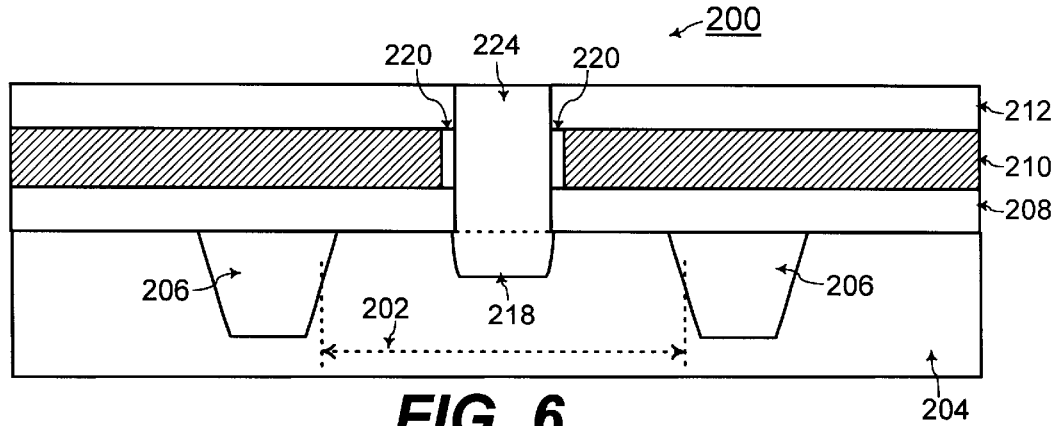

Referring to FIGS. 5 and 6, after the silicon dioxide 222 is etched away from the semiconductor substrate 204 at the bottom wall of the channel opening 216, the channel opening 216 is filled with a semiconductor material 224 by epitaxially growing the semiconductor material 224 from the semiconductor substrate 204 at the bottom wall of the channel opening 216. For example, when the semiconductor substrate 204 is comprised of silicon, silicon is the semiconductor material 224 that is epitaxially grown through the channel opening 216 from the silicon substrate 204 at the bottom wall of the channel opening 216 to fill the channel opening 216. Processes for epitaxially growing silicon from the silicon substrate 204 are known to one of ordinary skill in the art of integrated circuit fabrication. Referring to FIG. 6, the interface between the semiconductor material 224 and the drain region 218 that has the source and drain dopant implanted therein is illustrated with a dashed line in FIG. 6.

Figure 7:
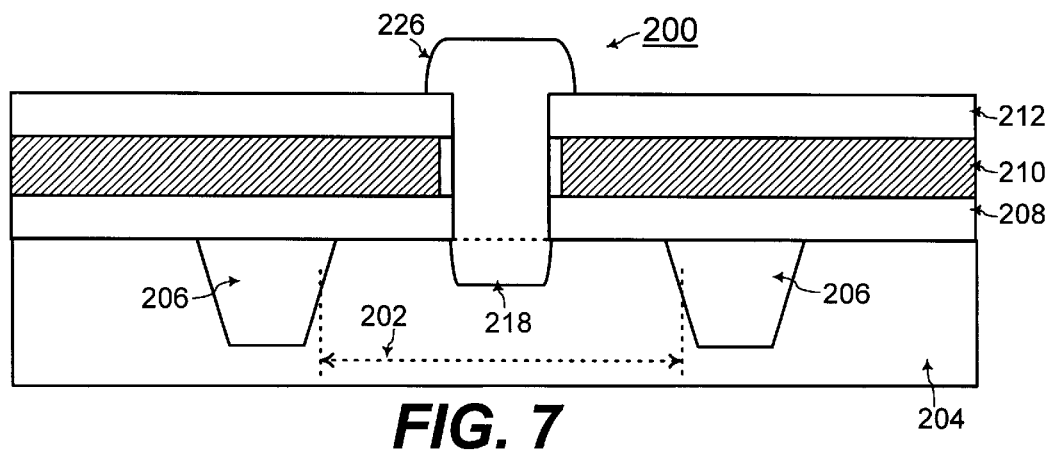

Referring to FIGS. 6 and 7, a semiconductor structure 226 is further epitaxially grown from the semiconductor material 224 filling the channel opening 216, and the semiconductor structure 226 extends above the channel opening 216. For example, when the semiconductor material 224 is comprised of silicon, the semiconductor structure 226 may be comprised of silicon that is epitaxially grown from the silicon filling the channel opening 216. Processes for epitaxially growing the semiconductor structure 226 from the silicon filling the channel opening 216 are known to one of ordinary skill in the art of integrated circuit fabrication.

Figure 8:
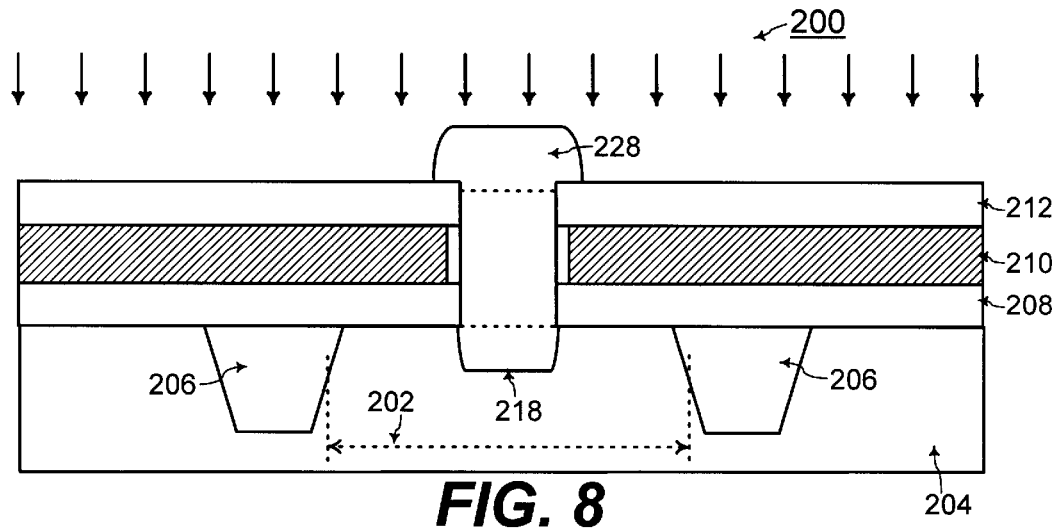

Referring to FIGS. 7 and 8, after formation of the semiconductor structure 226, the source and drain dopant is implanted into the semiconductor structure 226 to form a source region 228 of the vertical field effect transistor 200. Referring to FIG. 8, the interface between the semiconductor material 224 and the source region 228 that has the source and drain dopant implanted therein is illustrated with a dashed line in FIG. 8. Processes for implanting the source and drain dopant to form the source region 228 are known to one of ordinary skill in the art of integrated circuit fabrication.

In one embodiment of the present invention, the semiconductor substrate 204, the semiconductor material 224 filling the channel opening 216, and the semiconductor structure 226 are comprised of a P-type semiconductor material, and the source and drain dopant is comprised of an N-type dopant for formation of a NMOSFET (N-channel Metal Oxide Semiconductor Field Effect Transistor). In another embodiment of the present invention, the semiconductor substrate 204, the semiconductor material 224 filling the channel opening 216, and the semiconductor structure 226 are comprised of an N-type semiconductor material, and the source and drain dopant is comprised of a P-type dopant for formation of a PMOSFET (P-channel Metal Oxide Semiconductor Field Effect Transistor).

Figure 9:
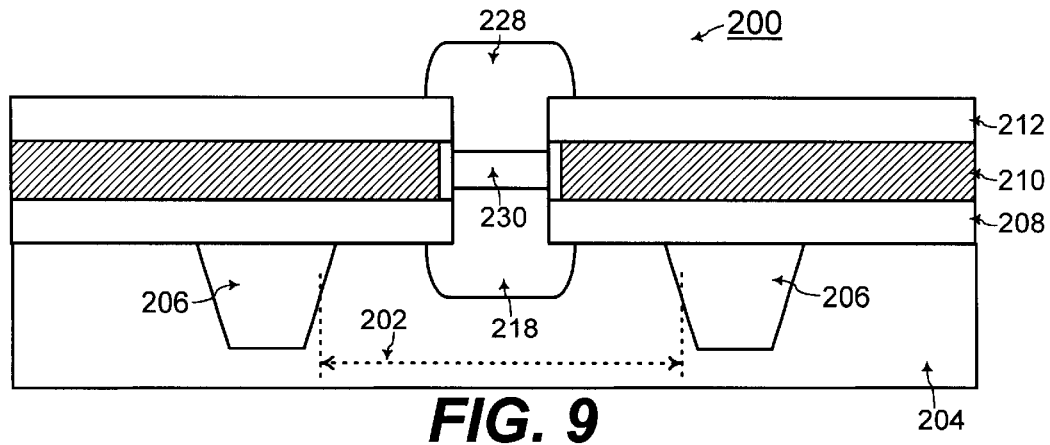

Referring to FIG. 9, a thermal anneal is performed such that the drain region 218 extends up into the channel opening 216 to be between the metal oxide 220 at the sidewalls of the channel opening 216. Similarly, during the thermal anneal, the source region 228 extends down into the channel opening 216 to be between the metal oxide 220 at the sidewalls of the channel opening 216. For proper operation of the vertical field effect transistor 200, the metal oxide 220 which forms the gate dielectric of the vertical field effect transistor 200 overlaps the drain region 218 and the source region 228. However, a portion 230 of the semiconductor material in the channel region 216 remains undoped without the source and drain dopant between the drain region 218 and the source region 228 to form a channel region 230 of the vertical field effect transistor 200.

Figure 1:
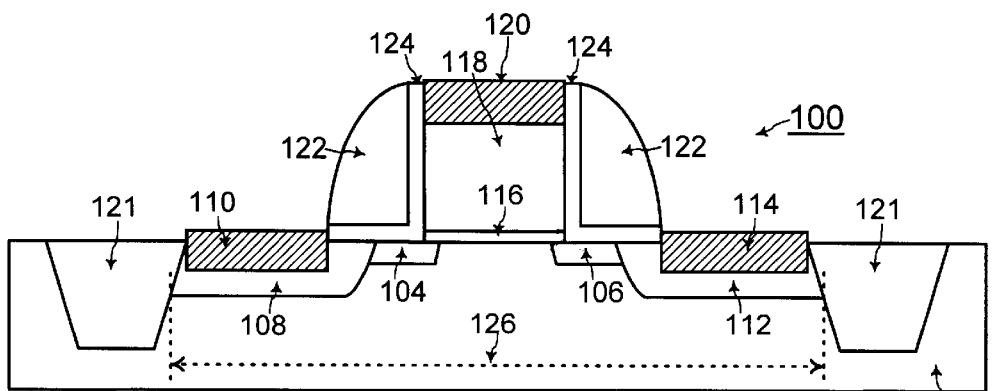
FIG. 1 shows a cross-sectional view of a conventional lateral MOSFET (Metal Oxide Semiconductor Field Effect Transistor), according to the prior art.

In this manner, because the drain region 218, the channel region 230, and the source region 228 of the vertical field effect transistor 200 are formed vertically upward from the semiconductor substrate 204, the field effect transistor 200 may occupy less space of the semiconductor substrate 204 than the conventional lateral field effect transistor of the prior art. Thus, the active device area 202 of the vertical field effect transistor 200 may be smaller than the active device area 126 of the conventional lateral MOSFET 100 of FIG. 1.

Figure 10:
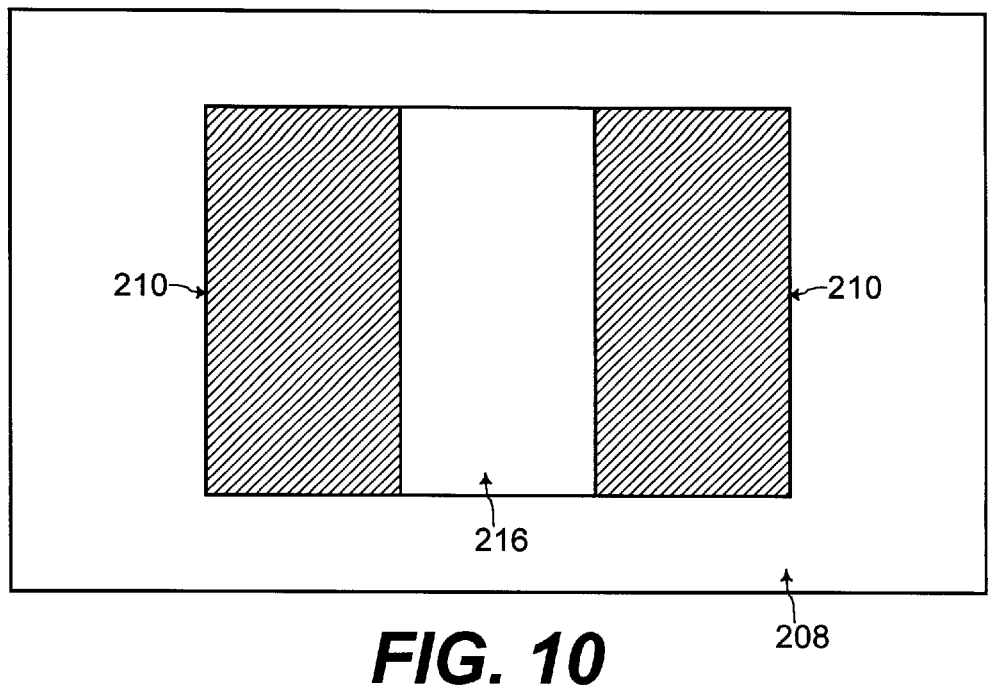
FIG. 10 shows a top view of the layer of metal surrounding the channel opening at two side walls for forming a double gate structure of the vertical field effect transistor, according to an embodiment of the present invention.
Figure 11:
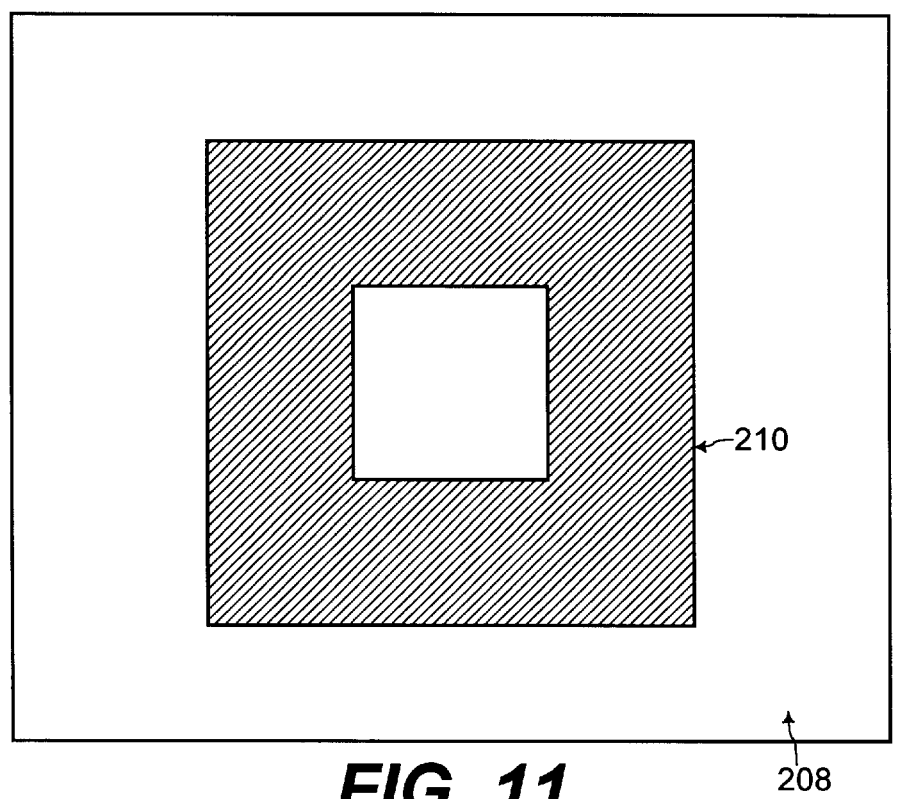
FIG. 11 shows a top view of the layer of metal surrounding the channel opening at all side walls for forming a surrounded gate structure of the vertical field effect transistor, according to an embodiment of the present invention.

In addition because the gate of the vertical field effect transistor 200 is formed at a plurality of sidewalls of the channel opening, short channel effects of the vertical field effect transistor 200 may be further controlled and prevented. FIGS. 10 and 11 illustrate a top view of the layer of metal 210 deposited on the first layer of dielectric material 208. In FIG. 10, the layer of metal 210 which is the gate of the vertical field effect transistor 200 forms a dual gate structure since the layer of metal 210 is disposed at two sidewalls of the channel opening 216. In FIG. 11, the layer of metal 210 which is the gate of the vertical field effect transistor 200 forms a surrounded gate structure since the layer of metal 210 surrounds the sidewalls of the channel opening 216. In either case, the layer of metal 210 at a plurality of sidewalls of the channel opening 216 is more amenable for controlling and preventing disadvantageous short-channel effects in the vertical field effect transistor 200.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "up," "down," "side wall," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a vertical field effect transistor on a semiconductor substrate, the method including the steps of:

A. depositing a first layer of dielectric material on said semiconductor substrate;

B. depositing a layer of metal on said first layer of dielectric material;

C. depositing a second layer of dielectric material on said layer of metal;

D. etching a channel opening through said second layer of dielectric material, said layer of metal, and said first layer of dielectric material;

E. implanting a source and drain dopant through said channel opening and into said semiconductor substrate to form a drain region of said vertical field effect transistor in said semiconductor substrate;

F. forming a metal oxide at any exposed surface of said layer of metal on sidewalls of said channel opening in a thermal oxidation process, wherein said metal oxide is a gate dielectric of said vertical field effect transistor;

G. filling said opening with a semiconductor material by epitaxially growing said semiconductor material from said semiconductor substrate at a bottom wall of said channel opening;

H. growing a semiconductor structure from said semiconductor material filling said channel opening, wherein said semiconductor structure extends above said channel opening;

I. implanting said source and drain dopant into said semiconductor structure to form a source region of said vertical field effect transistor; and wherein said drain region doped with said source and drain dopant does not extend substantially into said channel opening before performance of a thermal anneal, and wherein said source region doped with said source and drain dopant does not extend substantially into said channel opening before performance of a thermal anneal;

J. performing a thermal anneal such that said drain region doped with said source and drain dopant extends into said channel opening to be between said metal oxide at said sidewalls of said channel opening after said thermal anneal and such that said source region doped with said source and drain dopant extends into said channel opening to be between said metal oxide at said sidewalls of said channel opening after said thermal anneal, wherein a portion of said semiconductor material in said channel opening remains undoped without said source and drain dopant between said drain region and said source region to form a channel region of said vertical field effect transistor.

2. The method of claim 1, wherein said first layer of dielectric material is comprised of silicon dioxide having a thickness in a range of from about 300 Å to about 500 Å.

3. The method of claim 2, wherein said layer of metal is comprised of one of aluminum, titanium, or tantalum having a thickness in a range of from about 200 Å to about 1000 Å, and wherein said metal oxide is comprised of one of aluminum oxide ($Al_2O_3$), titanium oxide ($TiO_2$), and tantalum oxide ($Ta_2O_5$).

4. The method of claim 1, wherein said second layer of dielectric material is comprised of silicon dioxide having a thickness in a range of from about 300 Å to about 500 Å.

5. The method of claim 1, wherein said channel opening has a width in a range of from about 10 nanometers to about 50 nanometers.

6. The method of claim 1, wherein said semiconductor substrate is comprised of silicon, and wherein silicon dioxide forms at a bottom wall of said channel opening during said thermal oxidation process for forming said metal oxide, and wherein said method further includes the step of:

etching away said silicon dioxide at said bottom wall of said channel opening before said step G.

7. The method of claim 6, wherein said semiconductor material filling said channel opening is comprised of silicon grown epitaxially from said semiconductor substrate at said bottom wall of said channel opening.

8. The method of claim 7, wherein said semiconductor structure is comprised of silicon epitaxially grown from said silicon filling said channel opening.

9. The method of claim 1, wherein said semiconductor substrate, said semiconductor material filling said channel opening, and said semiconductor structure are comprised of a P-type semiconductor material, and wherein said source and drain dopant is comprised of an N-type dopant for formation of a NMOSFET (N-channel Metal Oxide Semiconductor Field Effect Transistor).

10. The method of claim 1, wherein said semiconductor substrate, said semiconductor material filling said channel opening, and said semiconductor structure are comprised of a N-type semiconductor material, and wherein said source and drain dopant is comprised of a P-type dopant for formation of a PMOSFET (P-channel Metal Oxide Semiconductor Field Effect Transistor).

* * * * *